(12) United States Patent
Parikh

(10) Patent No.: US 10,867,858 B2
(45) Date of Patent: Dec. 15, 2020

(54) SIMULTANEOUS METAL PATTERNING FOR 3D INTERCONNECTS

(71) Applicant: Applied Materials, Inc., Santa Clara, CA (US)

(72) Inventor: Suketu A. Parikh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/570,436

(22) Filed: Sep. 13, 2019

(65) Prior Publication Data

US 2020/0091002 A1    Mar. 19, 2020

Related U.S. Application Data

(60) Provisional application No. 62/731,584, filed on Sep. 14, 2018.

(51) Int. Cl.
| | | |
|---|---|---|
| *H01L 21/822* | (2006.01) | |
| *H01L 21/027* | (2006.01) | |
| *H01L 21/762* | (2006.01) | |
| *H01L 21/32* | (2006.01) | |

(52) U.S. Cl.
CPC ...... *H01L 21/8221* (2013.01); *H01L 21/0276* (2013.01); *H01L 21/32* (2013.01); *H01L 21/76224* (2013.01)

(58) Field of Classification Search
CPC .................................................. H01L 21/8221
USPC .......................................................... 438/736
See application file for complete search history.

(56) References Cited

U.S. PATENT DOCUMENTS

| | | |
|---|---|---|
| 4,996,133 A | 2/1991 | Brighton et al. |
| 6,133,635 A | 10/2000 | Bothra et al. |
| 6,906,370 B1 * | 6/2005 | Hubner ............. H01L 21/76895 257/296 |
| 2010/0015792 A1 | 1/2010 | Lee et al. |
| 2011/0121427 A1 | 5/2011 | Stupar et al. |

(Continued)

FOREIGN PATENT DOCUMENTS

| | | |
|---|---|---|
| CN | 105684140 A | 6/2016 |
| JP | H10-173051 A | 6/1998 |

(Continued)

OTHER PUBLICATIONS

International Search Report and Written Opinion dated Dec. 27, 2019 in International Patent Application No. PCT/US2019/050732, all pages.

*Primary Examiner* — Roberts P Culbert
(74) *Attorney, Agent, or Firm* — Kilpatrick Townsend & Stockton LLP

(57) ABSTRACT

Processing methods may be performed to produce three-dimensional interconnects on a substrate. The methods may include forming a first metal interconnect layer over a semiconductor substrate. The methods may include forming a first dielectric layer over the first metal interconnect layer. The methods may include forming a second metal interconnect layer over the first dielectric layer. The methods may include forming a patterning mask overlying the second metal interconnect layer. The methods may also include simultaneously etching each of the first metal interconnect layer, the first dielectric layer, and the second metal interconnect layer to expose the substrate to produce a multilayer interconnect structure in a first lateral direction.

20 Claims, 9 Drawing Sheets

(56) References Cited

U.S. PATENT DOCUMENTS

2011/0298134 A1 12/2011 Williams et al.
2013/0168867 A1 7/2013 Shim
2015/0001724 A1 1/2015 Chandhok et al.

FOREIGN PATENT DOCUMENTS

TW 201236108 A 9/2012
TW 201320282 A 5/2013

* cited by examiner

SIMULTANEOUS METAL PATTERNING FOR 3D INTERCONNECTS

CROSS-REFERENCES TO RELATED APPLICATIONS

This application claims the benefit of U.S. Provisional Patent Application No. 62/731,584, filed on Sep. 14, 2018, and which is hereby incorporated by reference in its entirety for all purposes.

TECHNICAL FIELD

The present technology relates to semiconductor systems, processes, and equipment. More specifically, the present technology relates to systems and methods for forming and etching material layers on a semiconductor structure.

BACKGROUND

Integrated circuits are made possible by processes which produce intricately patterned material layers on substrate surfaces. Producing patterned material on a substrate requires controlled methods for removal of exposed material. Lithography is used for a variety of purposes by transferring a pattern into underlying layers, which can allow the formation of segmented layers, or thinning lateral dimensions of features already present on the surface. As device sizes continue to shrink, lithographic techniques can take a number of operations to allow feature spacing in the nanometer range.

With this increased number of operations, as well as complexity of the techniques such as extreme ultraviolet lithography, the cost for fine lithography can be prohibitive. As multiple layers may each be formed by these expensive techniques, along with the increasing density of transistors or other structures on a substrate, costs can rise dramatically. Additionally, in certain processing with metal materials, as line width continues to shrink, resistance and capacitance may both increase, detrimentally impacting the device being produced. The ability to precisely land contacts from overlying structures to underlying structures may also be challenged, which can lead to device scrapping when sufficient contacts are misaligned.

Thus, there is a need for improved systems and methods that can be used to produce high quality devices and structures. These and other needs are addressed by the present technology.

SUMMARY

Processing methods may be performed to produce three-dimensional interconnects on a substrate. The methods may include forming a first metal interconnect layer over a semiconductor substrate. The methods may include forming a first dielectric layer over the first metal interconnect layer. The methods may include forming a second metal interconnect layer over the first dielectric layer. The methods may include forming a patterning mask overlying the second metal interconnect layer. The methods may also include simultaneously etching each of the first metal interconnect layer, the first dielectric layer, and the second metal interconnect layer to expose the substrate to produce a multilayer interconnect structure in a first lateral direction.

In some embodiments, the patterning mask may be formed by extreme ultraviolet lithography, self-aligned double patterning, or self-aligned quadruple patterning. The first dielectric layer may be or include a low-k dielectric. The first metal interconnect layer and the second metal interconnect layer may be or include copper, cobalt, or tungsten. The methods may further include, prior to forming the first dielectric layer, forming a cut mask overlying the first metal interconnect layer. The methods may also include etching one or more apertures fully through the first metal interconnect layer. Forming the first dielectric layer may include filling the one or more apertures through the first metal interconnect layer with dielectric material. The cut mask may be formed by immersion lithography. A second dielectric layer may be formed between the substrate and the first metal interconnect layer. The methods may also include forming additional alternating metal interconnect layers and dielectric layers prior to forming the patterning mask.

Some embodiments of the present technology may also encompasses methods of forming three-dimensional metal interconnects. The methods may include forming a first metal interconnect layer over a semiconductor substrate. The methods may include forming a first dielectric layer over the first metal interconnect layer. The methods may include forming a second metal interconnect layer over the first dielectric layer. The methods may include forming a patterning mask overlying the second metal interconnect layer. The methods may include simultaneously etching each of the first metal interconnect layer, the first dielectric layer, and the second metal interconnect layer in a first lateral direction to expose a region of the substrate. The methods may include filling the exposed region with a low-k dielectric material to produce a structure. The methods may include forming one or more vias through the structure. The methods may include forming a first liner within each of the one or more vias. The methods may also include selectively recessing the first liner to expose one of the first metal interconnect layer or the second metal interconnect layer.

In some embodiments, the patterning mask may be formed by extreme ultraviolet lithography, self-aligned double patterning, or self-aligned quadruple patterning. The first dielectric layer may be or include a low-k dielectric material. The first metal interconnect layer and the second metal interconnect layer may be or include copper, cobalt, or tungsten. Forming a first liner within each of the one or more vias may include forming a conformal dielectric liner within each via. The methods may also include selectively opening at least one of the one or more vias to access a contact at the substrate. The methods may also include, subsequent forming a first liner within each of the one or more vias, filling each via of the one or more vias with a bottom anti-reflectant coating. The methods may also include recessing the bottom anti-reflectant coating to below a level of the first metal interconnect layer in at least one via of the one or more vias. The methods may also include forming a second liner over the first liner to a level above the first metal interconnect layer in the at least one via. The methods may also include selectively etching the first liner relative to the second liner to expose the first metal interconnect layer through the at least one via. The methods may also include filling the at least one via with a conductive material.

Such technology may provide numerous benefits over conventional systems and techniques. For example, by producing the patterning for multiple layers in a single patterning operation, the costs of producing layers may be dramatically reduced. Additionally, because the patterning can be performed to size multiple individual layers, the cut masks can be oversized in each layer as the final patterning can self-align each feature in a later operation. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
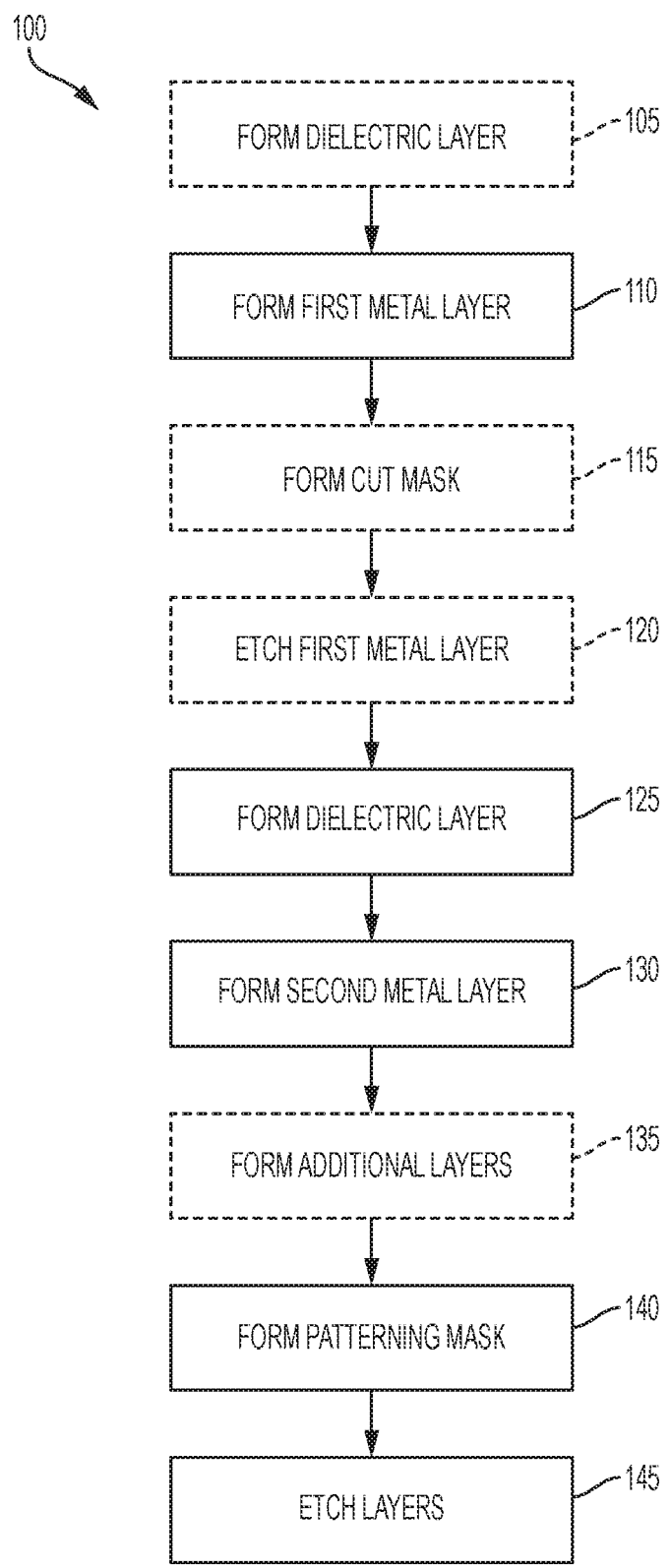
FIG. 1 shows selected operations in a method of forming a three-dimensional interconnect structure on a semiconductor structure according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

The present technology includes systems and components for semiconductor processing of small pitch features. As device sizes continue to shrink, dense transistor structures require many layers of conductive interconnects as well as thin line widths for each level. The complex structure can lead to an increase in line resistance as the length of thin metal lines from contacts up to global metal layers can be long. As the number and length of lines increases while the thickness decreases, line resistance can increase by threefold moving from, for example, 25 nm lines to 15 nm lines. Additionally, with the number of thin lines, parasitic capacitance can increase, further challenging efficient device performance. Parasitic capacitance tends to detrimentally affect device performance, and often occurs when parallel conductive lines are separated by dielectric. For example, in a transistor structures, the source and drain may be connected to a vertical conductive wire, and the gate may be connected with a vertical conductive wire as well. These conductive wires may be two metal wires that are running parallel to one another and are separated by a dielectric material, such as an oxide. This structure may cause a parasitic capacitance across the dielectric, which can be undesirable. This capacitance may essentially slow device performance by causing delays, which reduces the frequency of the device, and also contributes to power consumption. Parasitic capacitance depends on the dielectric constant of the intervening material as well as the spacing between the parallel wires. As device features shrink in size, less and less dielectric is positioned between the wires, which may increase parasitic capacitance.

Interconnect metallization conventionally occurs in back-end-of-line processing by producing alternating, orthogonal layers of metal. For example, a first metal layer is formed over a substrate, and patterned to produce a series of lines and contacts. Dielectric is deposited to fill the gaps and form an intervening layer, followed by formation of a second metal layer. This second metal layer is then patterned in an orthogonal direction from the first metal layer. These may be the M1 and M2 layers, as well as any other layers in the interconnect design, such as up through the M6 or higher layer. As line sizes are reduced for next generation devices, the pitch of lines can reduce below 30 nm or 20 nm. As this occurs, more complex lithography is utilized for each layer, such as extreme ultraviolet lithography, self-aligned double patterning, or self-aligned quadruple patterning. Each of these processes can be expensive and require tight alignment to afford contact with continually shrinking contacts and underlying layers. Additionally, these fine-scale lines can cause greatly increased line resistance as pitch size is reduced. For example, as device features become more dense and complex, fewer layers at smaller pitch may be formed, with an associated penalty to resistance and capacitance, or additional layers of interconnect metal may be formed, which may allow increased line sizing, but may incur an extensive fabrication cost with the additional masking and formation operations performed at every level.

The present technology overcomes these issues with several adjustments to the process for formation and patterning, and by utilizing an alternative interconnect structure. Specifically, the present technology may form multiple parallel interconnect layers prior to forming the orthogonal layers. For example, aspects of the present technology may produce the M1, M3, and M5 lines prior to producing the M2, M4, and M6 lines. By forming multiple parallel interconnect layers simultaneously, expensive patterning may be performed after multiple layers have been produced, which may allow increased line sizing, and reduced costs. Thus, for a set of six metal layers, conventional technology would have each alternating layer formed orthogonally, and each layer would require precise formation as well as an expensive and critical process such as extreme ultraviolet, self-aligned double patterning, or self-aligned quadruple patterning. The present technology, by producing three lines in a single direction followed by three lines in an orthogonal direction, may utilize much looser tolerances for each set, and only use a single critical etch with each group. Accordingly, the number of critical etches, such as with EUV, may be reduced from six to two. Put another way, the present technology may afford thicker line widths for smaller pitch device features, which may provide a limited line resistance and capacitance penalty, and may also reduce fabrication costs by providing a process in which a single small pitch or critical patterning etch may be performed for multiple layers simultaneously, while allowing less aggressive patterning to be performed between layers.

Although the remaining disclosure will routinely identify specific etching and deposition processes, it will be readily understood that any number of deposition, etching, polishing, and lithographic technology may be used in performing operations according to embodiments of the present technology. Accordingly, the technology should not be considered to be so limited as for use with any specific chambers.

FIG. 1 illustrates selected operations of a fabrication method 100. Method 100 may include one or more operations prior to the initiation of the method, including front end processing, deposition, etching, polishing, cleaning, or any other operations that may be performed prior to the described operations. The method may include a number of optional operations as denoted in the figure, which may or may not be specifically associated with some embodiments of methods according to the present technology. For example, many of the operations are described in order to provide a broader scope of the structural formation, but are not critical to the technology, or may be performed by alternative methodology as will be discussed further below. Method 100 describes operations shown schematically in FIG. 2, the illustrations of which will be described in conjunction with the operations of method 100. It is to be understood that FIG. 2 illustrates only partial schematic views with limited details, and a substrate may contain any number of transistor or semiconductor sections having aspects as illustrated in the figures, as well as alternative structural aspects that may still benefit from aspects of the present technology.

Figure 2A:
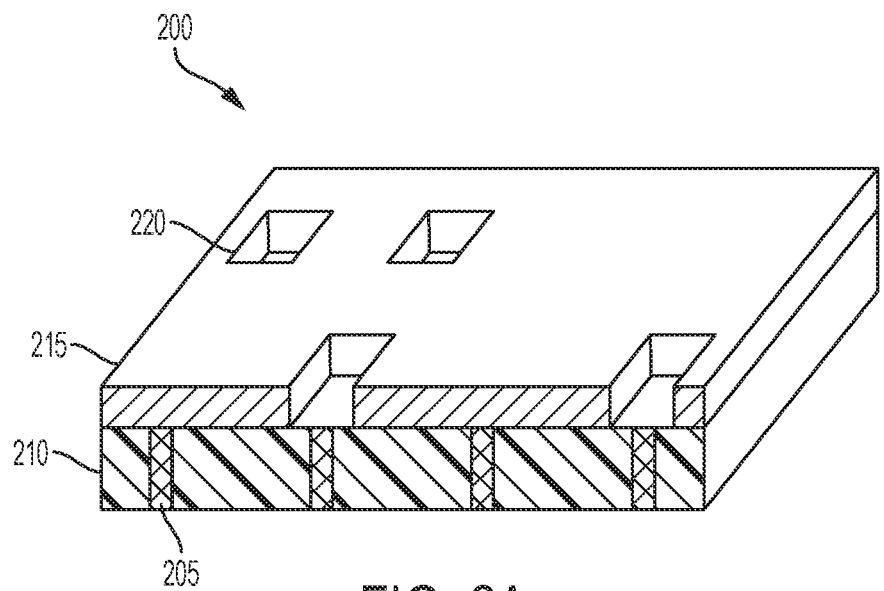
FIGS. 2A-2G illustrate schematic perspective views of substrate materials on which selected operations are being performed according to some embodiments of the present technology.

Method 100 may involve optional operations to develop the semiconductor structure to a particular fabrication operation. As illustrated in FIG. 2A, the semiconductor structure may represent a device 200 after front end processing has been completed. A number of transistors, or other semiconductor structures, may be formed on a substrate. Subsequent formation, contacts 205 may be formed and extend up through dielectric material 210, which may be an interlayer dielectric, or other material or structure through which contacts 205 may extend. Contacts 205 may be any number of conductive materials utilized in semiconductor fabrication, and may be, for example, copper, tungsten, cobalt, manganese, molybdenum, ruthenium, nickel, irridium, rhodium, nickel silicide, aluminum copper, titanium nitride, or any other conductive material that can be used in interconnects or other connective structure in semiconductor manufacturing.

Method 100 may involve forming a three-dimensional interconnect structure over such a substrate, or other semiconductor structure. The process may include forming alternating layers of a conductive material and a dielectric material. Depending on the fabrication order, a first-formed layer overlying the substrate may be either a metal material or a dielectric material. For example, an optional dielectric layer 215 may be formed overlying the substrate in some embodiments as illustrated in FIG. 2A during optional operation 105. Dielectric layer 215 may be any number of insulative materials, and may include any of oxygen, nitrogen, and/or carbon in embodiments. Dielectrics in any of the layers incorporated in the structures described may be or include low-k dielectrics. Exemplary materials may be or include silicon oxide, silicon nitride, silicon oxycarbide, silicon oxynitride, silicon carbonitride, silicon oxycarbonitride, or may be a porous or doped material including a fluorine-doped material, such as silicon dioxide, carbon-doped material, or polymeric dielectric. The deposition or formation may be performed in any of a variety of ways of performing a blanket deposition, flowable deposition, or conformal coating on the exposed structures to a thickness depending on the particular layer of the interconnect structure.

As illustrated, subsequent formation, a mask may be deposited over the dielectric followed by a subsequent etching operation to form vias 220, which may allow access to contacts 205. Because of the formation process according to embodiments of the present technology, the vias may not require critical dimension lithography, and may be performed with immersion lithography, such as by utilizing a liquid medium in the photolithography to enhance resolution over air gap lithographic techniques. Alternative lithography may also be used, but in embodiments, the lithography may not utilize extreme ultraviolet or self-aligned patterning techniques, which may otherwise be used conventionally. As will be explained, the present technology utilizes a final patterning operation of enhanced resolution to self-align multiple layers simultaneously. Accordingly, the vias 220 may be over-etched in some embodiments as corrections may be enabled with subsequent patterning.

The removal operation or via formation may be performed in any number of etching or processing chambers, which may allow a dielectric-selective etch to be performed or an etch selective towards the dielectric film, such as silicon oxide in one non-limiting example although any previously noted dielectric material may be used. The process may be performed using a dry etch process utilizing a plasma or remote plasma, which may produce plasma effluents of a halogen-containing precursor, such as, for example, a fluorine-containing precursor, or a chlorine-containing precursor. The process may also utilize a hydrogen-containing precursor in embodiments, which may also be included in the remote plasma or may bypass the remote plasma to interact with radical halogen-containing plasma effluents in the processing region. A number of non-plasma processes may similarly be performed, which may produce anisotropically etched vias in the structure, along with wet etching in some embodiments.

Such an etching process may be performed at virtually any chamber conditions as per the etching technique being performed. In one exemplary and non-limiting plasma-etching process, the etching may be performed below about 10 Torr in embodiments, and may be performed below or about 5 Torr in embodiments. The process may also be performed at a temperature below about 100° C. in embodiments, and may be performed below about 50° C. As performed in a chamber capable of performing etching operations, the process may anisotropically remove regions of the dielectric material selective to underlying material, metal, or any other exposed material. In embodiments, the process may have a selectivity relative to the first dielectric material relative to any other exposed material greater than or about 20:1, greater than or about 50:1, greater than or about 100:1, and may have a selectivity greater than or about 200:1, greater than or about 300:1, greater than or about 400:1, or greater than or about 500:1 in embodiments. Because of this selectivity, and because the amount of dielectric or other material may be relatively thin, all other exposed materials may be substantially or essentially maintained during this and other removal operations in the present technology.

Figure 2B:
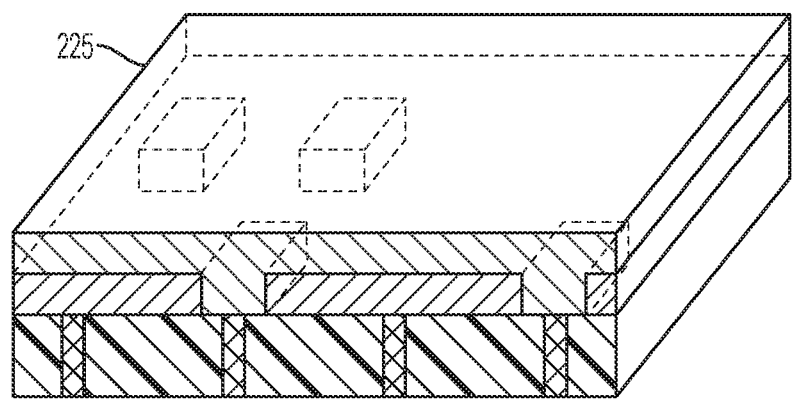
Figure 2C:
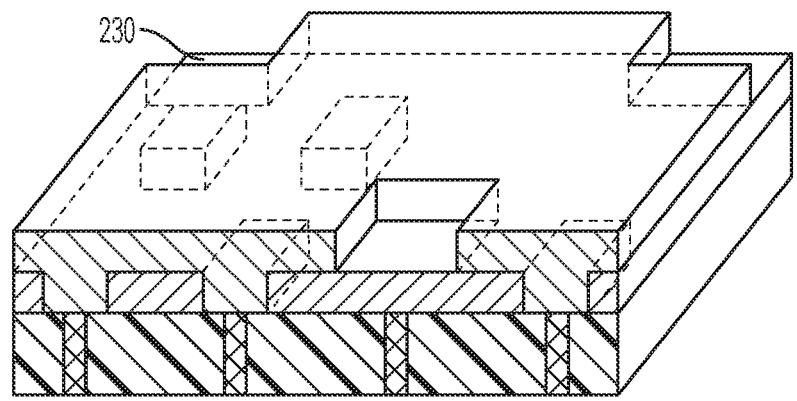

Subsequent formation of the dielectric layer and via opening operation, a first metal interconnect layer 225 may be formed over the substrate and/or optional dielectric layer at operation 110, as illustrated in FIG. 2B. The metal may be any of the previously noted metals, and may be deposited within the vias 220 and to a specified height for the M1 layer, for example, although a similar process may be performed for any other layer, which may be characterized by increasing thickness as the process moves towards global layers of interconnects. In some embodiments the metal layer may be formed to a thickness suitable for 50 nm lines or less, and may be formed to a thickness for less than or about 30 nm lines, less than or about 25 nm lines, less than or about 20 nm lines, less than or about 15 nm lines, or less. To limit topographical affects, selective metal fill may be performed on exposed metal material, followed by a subsequent blanket coating, which may limit planarization operations. Additionally, reflow may be used to further planarize the metal formed. A cut mask may optionally be formed over the metal layer 225 in optional operation 115. As previously explained, because the patterning operation may self-align multiple layers at once, a more aggressive cut mask technique may be used, such as immersion lithography, which may be less expensive than the patterning used conventionally at sub-30 nm pitch. After the cut mask has been formed, a metal-selective etch may be performed at optional operation 120 to recess the metal in pre-determined regions 230 as illustrated in FIG. 2C. The recesses may be formed in regions to be isolated during subsequent line lithography.

Figure 2D:
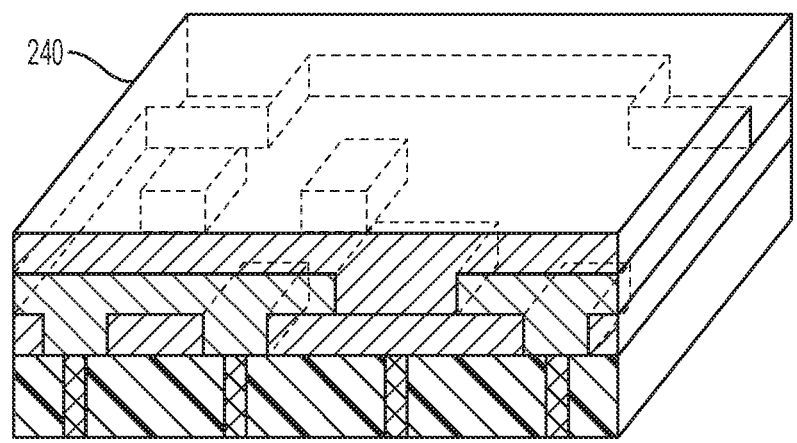

Subsequent the metal etching, a subsequent dielectric layer may be formed or deposited at operation 125. As illustrated in FIG. 2D, dielectric layer 240 may be formed to electrically isolate metal layer 225. The dielectric material may be any low-k or other dielectric material as previously described, and the dielectric may be formed in recessed region 230 to isolate particular portions of the structure after subsequent line cutting. Formation of the dielectric layer or layers and formation of the metal layer may also include additional processing such as planarization, for example, although techniques described above may be employed to limit planarization. With regard to the dielectric, for example, a flowable dielectric may be used or deposited to limit additional planarization operations. The process of forming the layers may then be repeated to produce additional metal layers intended to have lines in a similar direction. For example, the process may form the M1, M3, and M5 layers, as well as potentially form multiple layers for one or more of the layers, such as an M1 L, M1 R, M3, M5, or any other combination where multiple layers may be formed.

Figure 2E:
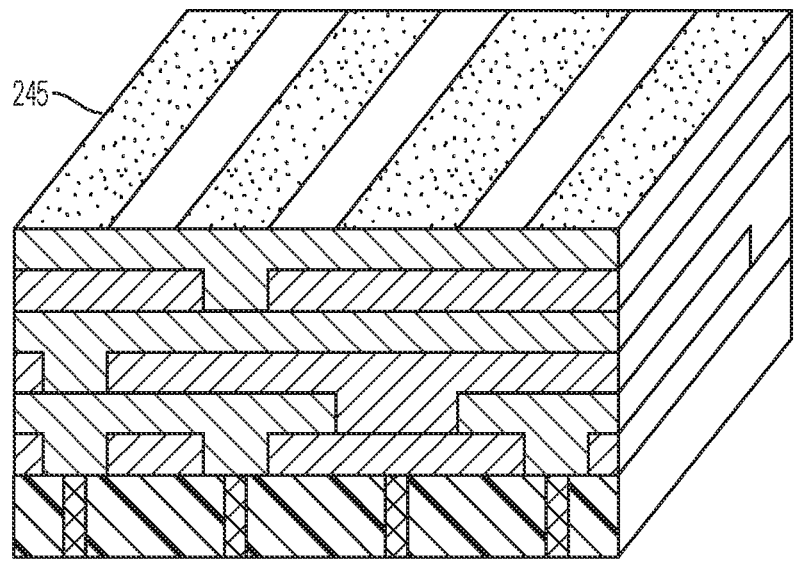

For example, vias may be formed through dielectric layer 240 similar to the vias formed previously, and may provide access to metal layer 225 in particular regions. A second metal layer may be formed overlying the open via dielectric layer 240 at operation 130. A selective deposition, for example, may be performed to selectively deposit metal or other conductive material within the vias on the exposed regions of layer 225. A blanket coverage may then be performed to develop a subsequent metal layer to any thickness, such as to the M3 layer thickness. Again, a cut mask may be formed over the subsequent metal layer similar to layer 225, and may provide recessed areas of the second metal layer. The process may be repeated to produce any number of alternative layers of dielectric material and metal material as noted in optional operation 135, which may include any number of M1, M3, and/or M5 metal layers. For example, as illustrated in FIG. 2E, three metal and three dielectric layers have been formed, although it is to be understood that more or less layers may be formed in exemplary processes according to embodiments of the present technology. As previously explained, each layer may include cut masks formed using less expensive immersion lithography as opposed to critical masking used in conventional technology.

As noted above, alternating layers were conventionally formed orthogonally to the previous or next metal layer, which for small pitch features, such as say under 30 nm pitch or under 20 nm pitch, required expensive masking operations for each individual metal layer including both cut masks and line masks, because the next layer would be formed in the opposite direction and would not accommodate the patterning. The present technology however, adjusts the layers within the metal stack to allow multiple layers to be patterned at once, or during a single etching operation or process. Thus, the internal cut masks can be performed essentially with technology for a previous technology node, which provides multiple benefits. For example, the cost may be much less than extreme ultraviolet or self-aligned double or quadruple patterning, such as tens of millions of dollars less, and additionally the vias may be formed larger to ensure access to underlying contacts. This may be enabled due to the later line cut reducing any oversized via to the proper dimension.

Figure 2F:
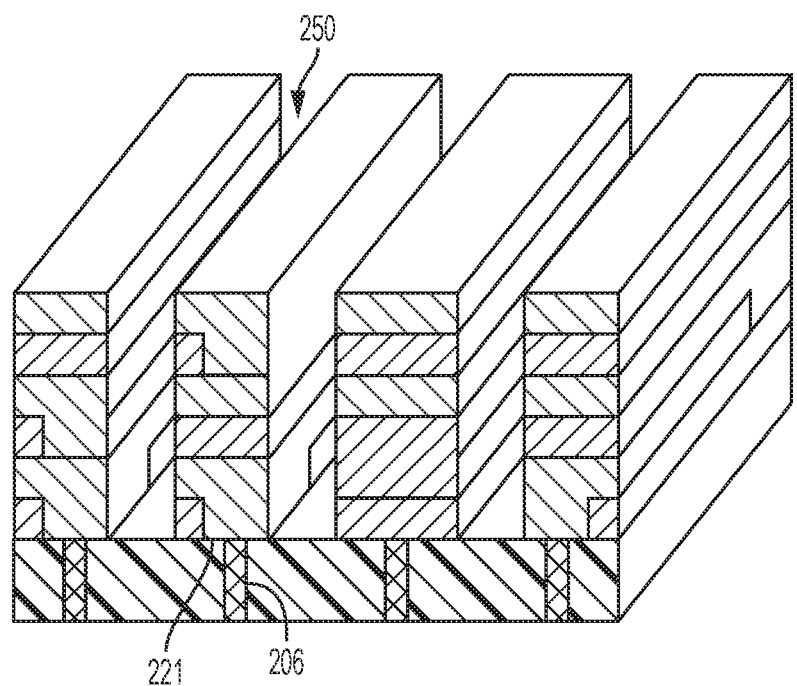

Subsequent the metal and dielectric layer formation, a patterning mask may be formed over the multi-layer structure to produce lines at operation 140. As previously explained, the present technology may produce the critical line structures and separations in a single patterning operation. Accordingly, operation 140 may be performed utilizing a high resolution lithographic process, which may include extreme ultraviolet lithography, self-aligned double patterning, self-aligned quadruple patterning, or some other process to produce mask 245 as illustrated in FIG. 2E. The high resolution lithography may pattern lines of more narrow pitch, such as less than 30 nm, and may pattern 25 nm lines, 15 nm lines, or narrower lines, for example. An etch may then be performed at operation 145 to produce lines 250 through all formed layers simultaneously. By simultaneously is meant that an etching process may be performed to etch through each of the metal and dielectric layers using the single mask 245. Although multiple etch processes may be performed, such as a metal-selective etch process, followed by a dielectric-selective etch process, which may occur in the same or different chambers, additional masking may not be performed during the etching. Thus, the etching may be performed sequentially through each layer to produce lines 250 utilizing a single high resolution mask. The lines may be formed down to the substrate level, and may expose regions of the substrate, which may be a region of interlayer dielectric 210, or any other material, as illustrated in FIG. 2F. In some embodiments an etch stop layer may be formed over the substrate, which may have been recessed in certain regions during the initial via open operation. The technique may produce a three-dimensional interconnect structure having all lines formed in a similar direction, such as the M1, M3, and M5 lines, which may all be in a first lateral direction.

Figure 2G:
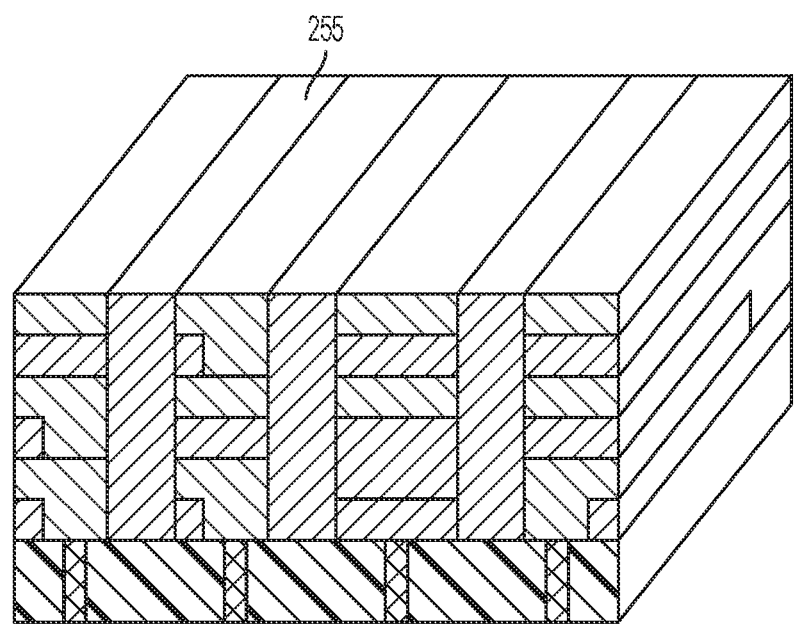

Additionally, the etch may self-align all vias and recesses previously formed. For example, via 221 may have been formed laterally further than the final dimension illustrated. The larger via 221 may be formed with less precision, which may reduce cost, and may ensure that the underlying contact 206 is fully exposed. The fill with metal 225 may then be confidently performed to fully cover contact 206 providing improved connections, less likely to have partial coverage, which may increase line resistance. When the subsequent precision patterning is performed for the line cut at operation 145, the excess material may be removed, self-aligning the via to the correct dimension, while maintaining the complete coverage of the contact. The lines may then be filled with dielectric 255 as illustrated in FIG. 2G to produce an exemplary line structure, which may be an M1, M3, and M5 structure. The process may then be repeated in the orthogonal direction to produce the M2, M4, and M6 layers to produce perpendicular lines. The even interconnect layers may also be formed in a similar direction, and may all be in a second lateral direction perpendicular to the first lateral direction. The M2, M4, and M6 layers, as well as any number of additional layers, may be formed by the same process over the illustrated structure to produce an M1-M5 or M6 interconnect structure.

While conventional technologies may include a critical mask and patterning operation for every level, which may include multiple levels as previously described, the present technology can form as many levels with only two critical masking operations. Accordingly, instead or five, ten, or even twenty critical masking and etching operations, the present technology may perform a single critical mask for each direction of lines, such as two, for example. This may allow a cost-effective solution to provide thicker lines despite reduced device pitch, because the cost of patterning additional metal layers may be greatly reduced.

Figure 3:
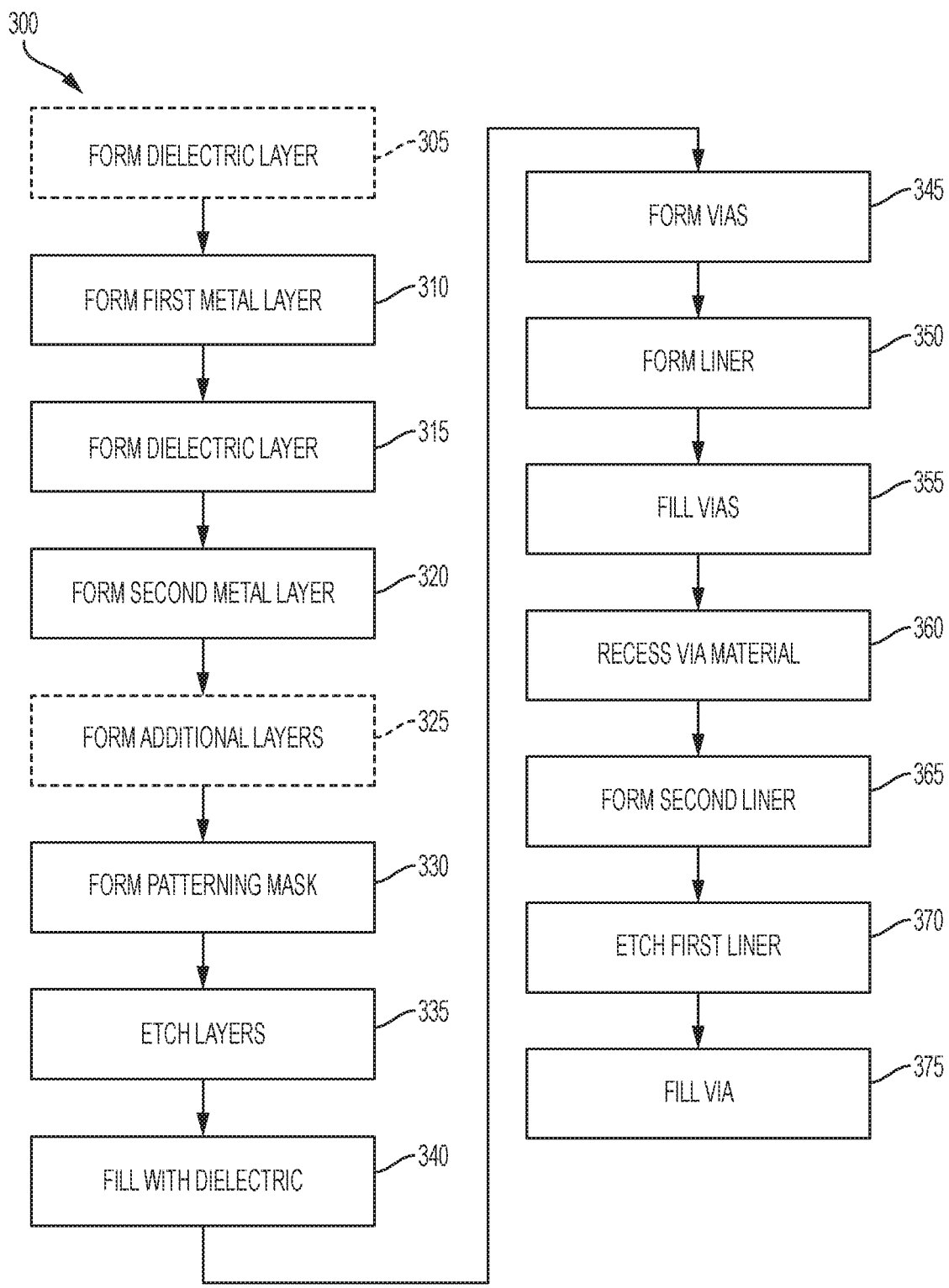
FIG. 3 shows selected operations in a method of forming a three-dimensional interconnect structure on a semiconductor structure according to some embodiments of the present technology.

Turning to FIG. 3 is illustrated selected operations of a fabrication method 300. Method 300 may include any of the materials or processes previously described, and similarly to method 100, may include multiple layers of simultaneous patterning. Method 300 may include one or more operations prior to the initiation of the method, including front end processing, deposition, etching, polishing, cleaning, or any other operations that may be performed prior to the described operations, as noted previously with method 100. The method may include a number of optional operations as denoted in the figure, which may or may not be specifically associated with some embodiments of methods according to the present technology. Method 300 describes operations shown schematically in FIG. 4, the illustrations of which will be described in conjunction with the operations of method 300. It is to be understood that FIG. 4 illustrates only partial schematic views with limited details, and a substrate may contain any number of transistor or semiconductor sections having aspects as illustrated in the figures, as well as alternative structural aspects that may still benefit from any of the aspects of the present technology.

Figure 4A:
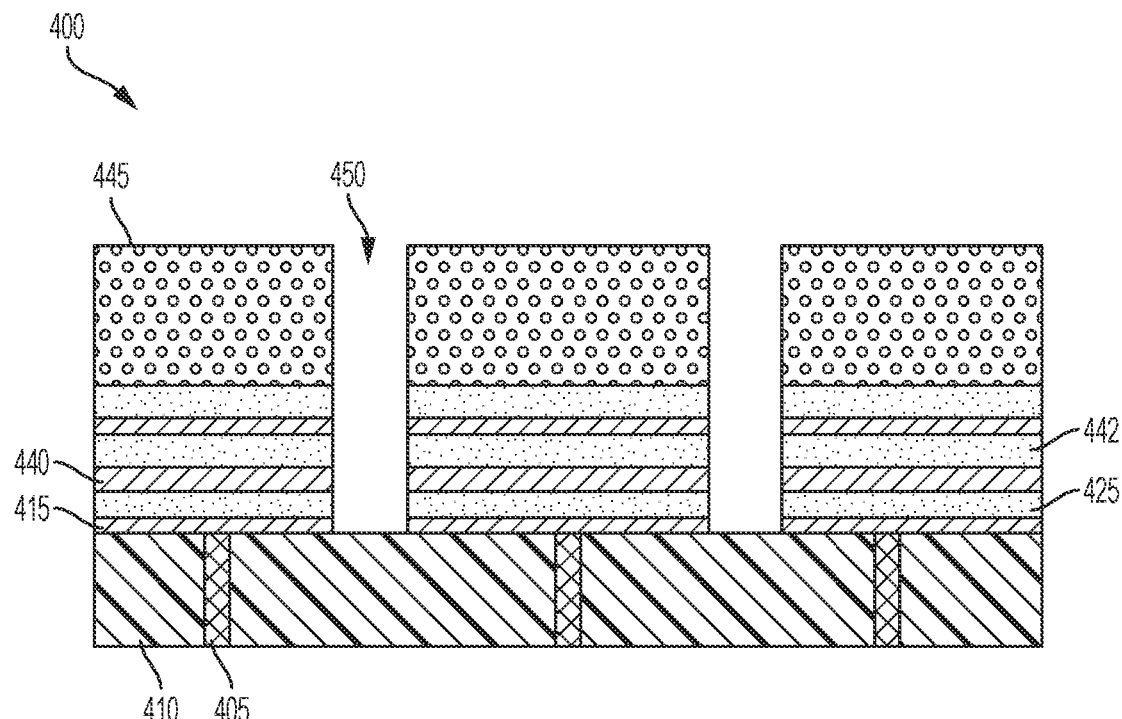
FIGS. 4A-4F illustrate schematic perspective views of substrate materials on which selected operations are being performed according to some embodiments of the present technology.

Method 300 may involve optional operations to develop the semiconductor structure to a particular fabrication operation, and may include many of the operations of method 100. Method 300 may differ from method 100 in that in some embodiments no cut masks may be formed during the layering structure and line cutting operations. As illustrated in FIG. 4A, the semiconductor structure may represent a device 400 after front end processing has been completed as well as metal deposition for multiple metal layers, such as may be at least partially illustrated in FIG. 2F previously. For example, at optional operation 305, a dielectric layer 415 may be formed overlying a substrate, which may be a formed substrate including transistor, memory, or other semiconductor structures, although it is to be understood that the first-formed layer may be a metal layer. The substrate may include an interlayer dielectric material 410 including a number of contacts 405, which may be plugs or filled vias of conductive material, and which can be any of the previously described conductive materials. Dielectric layer 415 may also include any number of materials previously described including any low-k materials.

Method 300 may involve forming a three-dimensional interconnect structure over such a substrate, or other semiconductor structure, and may include some or any of the processes described above for method 100. The process may include forming alternating layers of a conductive material and a dielectric material. For example, device 400 may include a first metal interconnect layer 425 formed at operation 310, a dielectric layer 440 overlying the first metal interconnect layer 425 formed at operation 315, and may include a second metal interconnect layer 442 overlying the dielectric layer 440 formed at operation 320. Dielectric layer 440 may, as illustrated, be between and in contact with each of first metal interconnect layer 425 and second metal interconnect layer 442.

As shown in FIG. 4A, device 400 may include additional alternating layers of dielectric material and metal or conductive material formed at optional operation 325. These additional layers may be formed to any height and may include any number of metal layers, which may produce initial interconnect layers M1, M3, and/or M5, or higher layers, and may include any number of layers per specified metal layer. Each layer may be formed to accommodate any of the line and feature widths previously described, and may be formed based on 30 nm pitch features or lines, or lower pitch features or lines, such as less than or about 25 nm pitch, less than or about 15 nm pitch, less than or about 10 nm pitch, or less. Although in some embodiments vias and recesses or plugs may be formed similar to method 100 described above, in some embodiments, minimal or no interior masking or removal may be performed, as illustrated.

Figure 4B:
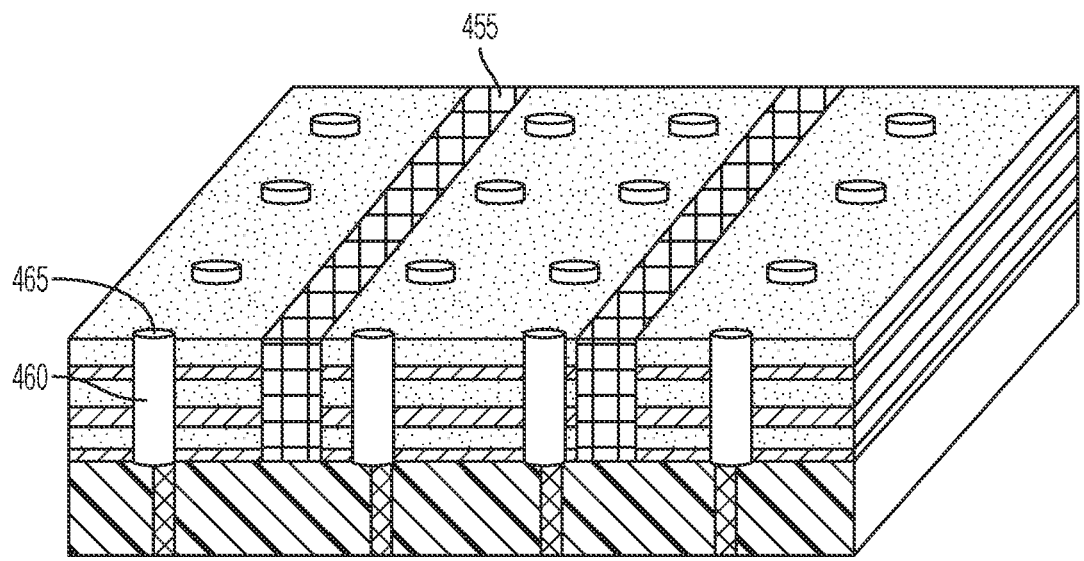

At operation 330, a patterning mask 445 may be formed overlying the structure. The patterning mask may be a high resolution mask, and may be formed by extreme ultraviolet, or self-aligned double or quadruple patterning, as well as any other high resolution masking, which may produce line widths or spacing according to the previously noted dimensions. At operation 335, an etching operation may be performed to simultaneously etch each of the layers as previously described, and may etch to material 410, and expose particular regions on the substrate with line cuts 450. The etching operation may produce interconnect lines all going in a first lateral direction as discussed above. Once formed, a dielectric material 455, which may be the same as the dielectric material in the alternating layers, may be deposited within the formed line cut regions 450 to isolate the formed interconnect lines at operation 340, as illustrated in FIG. 4B. In embodiments in which no vias or recesses were formed, at this point none of the metal layers may be connected, and thus there may not yet be electrical paths through the device.

To form the interconnections, vias 460 may be formed through the layers at operation 345. The vias may be formed to expose contacts 405, and may be formed in a variety of patterns through the layers. In some embodiments, the vias may be formed through the dielectric material 455 to expose edge regions of the metal material, although the vias may partially or be fully formed through the metal layers, but may be adjacent the dielectric material so as not to bisect the metal material in any particular layer. Hence, in some embodiments the vias may be formed adjacent dielectric material 455 and/or the cut layers of metal and dielectric. Although the vias may be formed to any length, in some embodiments the vias may each be formed to the level of the substrate. Once formed, a liner 465 may be formed within the vias at operation 350 to isolate the metal layers from the via. The liner may be conformally formed within the via using a number of deposition or formation techniques, and may be or include any insulative material previously described, as well as any insulative material including oxygen, nitrogen, and/or carbon, as well as one or more metals, such as tantalum, titanium, or any other metal that may produce a barrier or liner within the structure. One or more of the vias may be opened at the bottom to access a contact, and thus a punch-through operation may be performed through the liner in some vias at this time, or prior to metallization at a later operation.

Figure 4C:
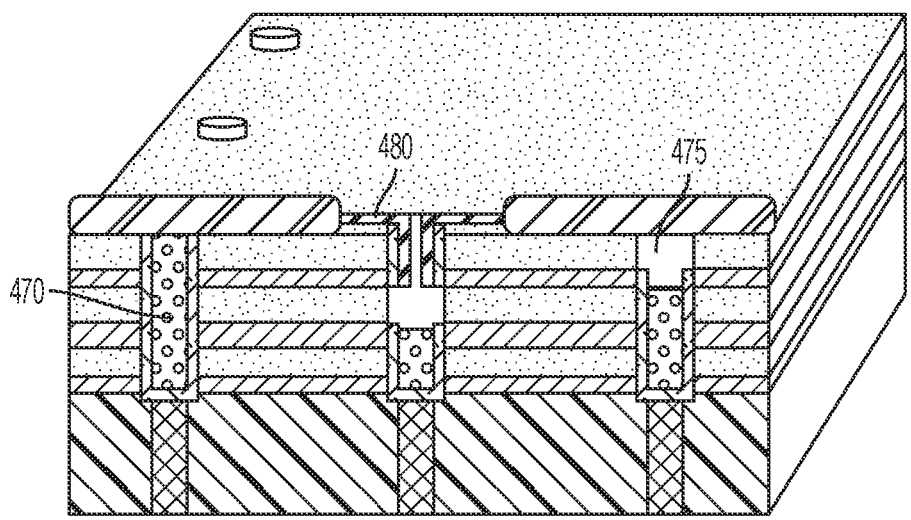

The lined vias may be filled at operation 355, shown in FIG. 4C, with a material allowing additional formation, but which may be readily removed from the structure. Although the material may be any dielectric or metal material, in some embodiments a bottom anti-reflectant coating 470 ("BARC") may be formed within the vias, which may be used to allow additional operations to be performed. At operation 360, a number of masking and removal operations may be performed to selectively remove the BARC or other material to a particular formed metal layer, and which may allow interconnects to be formed within each via. For example, the BARC may be removed partially down through the vias and the liner may be selectively removed in certain vias to expose the top layer of metal in certain vias, such as at 475, where the BARC and liner have been removed.

Additional masking may be performed over other vias during this removal to maintain the liner. The masking may then be removed and reversed or reformed to expose other vias. BARC may be recessed again down to below the uppermost metal layer or further, and in these next vias a second liner 480 may be formed at operation 365, which may be used to protect the first liner in later processing. At this stage, the BARC may have only been removed to the level of just below the top metal layer, and thus the liner may be formed partially down the via sidewalls, such as just below the first metal layer, to a level in line with the underlying dielectric material. The BARC may then be selectively removed from these vias with similar masking to below a level of the next underlying metal layer. A selective removal operation may then be performed to remove the first liner material, which may be exposed at the second metal interconnect layer from the top, while the second liner may protect the first liner at the level of the uppermost metal layer previously exposed in other vias. Thus, as illustrated in the middle via of FIG. 4C, the BARC 470 may protect the first liner in the lower metal layers, the second liner may protect the first liner in the upper metal layers, and the selective removal operation performed at operation 370 may remove the first liner only at the metal layer sought to be exposed in a middle region of the trench. This process may be repeated for other vias to expose any individual metal layer, or multiple metal layers within a single via.

Figure 4D:
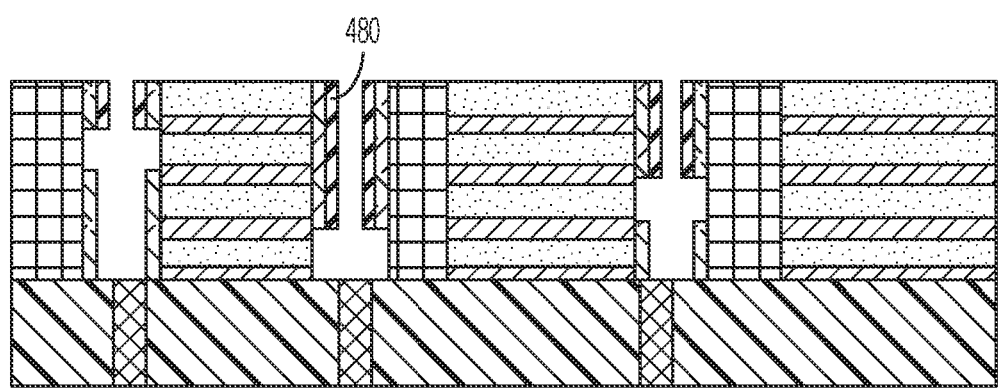
Figure 4E:
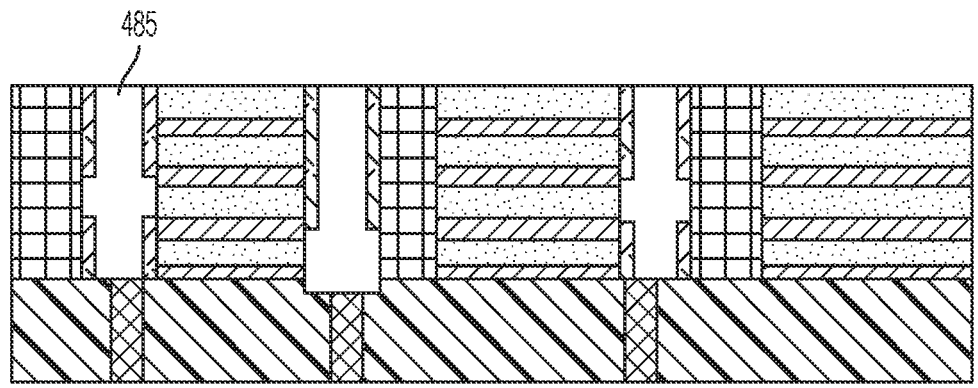

As illustrated in FIG. 4D, by performing the BARC or other material removal and forming a second liner, individual metal layers may be exposed through the vias to produce the interconnections for the device. After all the vias have been processed, a selective etch operation may be performed to remove the second liner material 480, while maintaining the first liner material. Hence, based on the removal operations of the first and second liners, the two liner materials may be different materials in some embodiments to allow selective removal of either layer relative to the other layer as described.

Figure 4F:
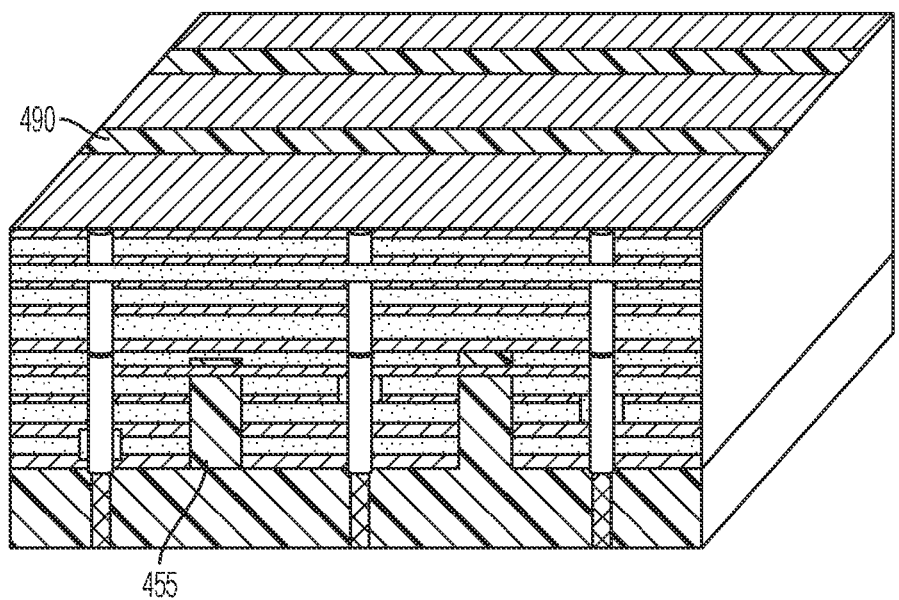

At operation 375, a conductive material 485 may be formed or deposited within each via, and which may form the interconnects through the layers. Based on the selective removal of the liner, the layers may be exposed at individual layers only, and not fully through the vias. The process may be repeated, or some combination of method 300 and method 100 may be performed to produce the next set of layers, such as the even metal layers, and which may produce another set of lines running perpendicularly to the first set of lines formed in method 300. In some embodiments either method 100 or method 300 may be used for either set of metal layers, or some combination of operations may be performed. As shown in FIG. 4F, a dielectric material 490 illustrates how a second set of lines may be formed in a second lateral direction orthogonally to the first set of lines formed in the first lateral direction about dielectric material 455. By using the present technology, improved interconnect structures may be formed, which may enhance accuracy for contact landing for small pitch features, and may perform cost effective patterning that produces line spacing for multiple metal layers with a single mask.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of forming three-dimensional metal interconnects, the method comprising:
   forming a first metal interconnect layer over a semiconductor substrate;
   forming a first dielectric layer over the first metal interconnect layer;
   forming a second metal interconnect layer over the first dielectric layer;
   forming a patterning mask overlying the second metal interconnect layer; and
   simultaneously etching each of the first metal interconnect layer, the first dielectric layer, and the second metal interconnect layer to expose the substrate to produce a multilayer interconnect structure in a first lateral direction.

2. The method of forming three-dimensional metal interconnects of claim 1, wherein the patterning mask is formed by extreme ultraviolet lithography, self-aligned double patterning, or self-aligned quadruple patterning.

3. The method of forming three-dimensional metal interconnects of claim 1, wherein the first dielectric layer comprises a low-k dielectric.

4. The method of forming three-dimensional metal interconnects of claim 1, wherein the first metal interconnect layer and the second metal interconnect layer comprise copper, cobalt, or tungsten.

5. The method of forming three-dimensional metal interconnects of claim 1, further comprising prior to forming the first dielectric layer:
   forming a cut mask overlying the first metal interconnect layer, and
   etching one or more apertures fully through the first metal interconnect layer.

6. The method of forming three-dimensional metal interconnects of claim 5, wherein forming the first dielectric layer comprises filling the one or more apertures through the first metal interconnect layer with dielectric material.

7. The method of forming three-dimensional metal interconnects of claim 5, wherein the cut mask is formed by immersion lithography.

8. The method of forming three-dimensional metal interconnects of claim 1, wherein a second dielectric layer is formed between the substrate and the first metal interconnect layer.

9. The method of forming three-dimensional metal interconnects of claim 1, further comprising forming additional alternating metal interconnect layers and dielectric layers prior to forming the patterning mask.

10. A method of forming three-dimensional metal interconnects, the method comprising:
    forming a first metal interconnect layer over a semiconductor substrate;
    forming a first dielectric layer over the first metal interconnect layer;
    forming a second metal interconnect layer over the first dielectric layer;
    forming a patterning mask overlying the second metal interconnect layer;
    simultaneously etching each of the first metal interconnect layer, the first dielectric layer, and the second metal interconnect layer in a first lateral direction to expose a region of the substrate;
    filling the exposed region with a low-k dielectric material to produce a structure;
    forming one or more vias through the structure;
    forming a first liner within each of the one or more vias; and
    selectively recessing the first liner to expose one of the first metal interconnect layer or the second metal interconnect layer.

11. The method of forming three-dimensional metal interconnects of claim 10, wherein the patterning mask is formed by extreme ultraviolet lithography, self-aligned double patterning, or self-aligned quadruple patterning.

12. The method of forming three-dimensional metal interconnects of claim 10, wherein the first dielectric layer comprises a low-k dielectric material.

13. The method of forming three-dimensional metal interconnects of claim 10, wherein the first metal interconnect layer and the second metal interconnect layer comprise copper, cobalt, or tungsten.

14. The method of forming three-dimensional metal interconnects of claim 10, wherein forming a first liner within each of the one or more vias comprises forming a conformal dielectric liner within each via.

15. The method of forming three-dimensional metal interconnects of claim 10, further comprising selectively opening at least one of the one or more vias to access a contact at the substrate.

16. The method of forming three-dimensional metal interconnects of claim 10, further comprising, subsequent forming a first liner within each of the one or more vias, filling each via of the one or more vias with a bottom anti-reflectant coating.

17. The method of forming three-dimensional metal interconnects of claim 16, further comprising recessing the bottom anti-reflectant coating to below a level of the first metal interconnect layer in at least one via of the one or more vias.

18. The method of forming three-dimensional metal interconnects of claim 17, further comprising forming a second liner over the first liner to a level above the first metal interconnect layer in the at least one via.

19. The method of forming three-dimensional metal interconnects of claim 18, further comprising selectively etching the first liner relative to the second liner to expose the first metal interconnect layer through the at least one via.

20. The method of forming three-dimensional metal interconnects of claim 19, further comprising filling the at least one via with a conductive material.

* * * * *